United States Patent [19]

Phillips

[11] Patent Number: 4,500,852
[45] Date of Patent: Feb. 19, 1985

[54] WIDE RANGE PHASE DETECTOR UTILIZING A PLURALITY OF STACKED DETECTOR MODULES

[75] Inventor: Donald E. Phillips, Cedar Rapids, Iowa

[73] Assignee: Rockwell International Corporation, El Segundo, Calif.

[21] Appl. No.: 449,121

[22] Filed: Dec. 13, 1982

[51] Int. Cl.³ .............................................. H03L 7/06
[52] U.S. Cl. ...................................... 331/12; 331/25; 328/134; 328/155; 307/516
[58] Field of Search .................. 331/11, 12, 25, 27; 328/133, 134, 155; 307/516

[56] References Cited

U.S. PATENT DOCUMENTS

| | | |
|---|---|---|
| 3,124,755 | 3/1964 | Williamson et al. ................ 328/134 |
| 3,176,208 | 3/1965 | Gifft ..................................... 318/314 |
| 3,431,509 | 3/1969 | Andrea ................................ 331/25 |
| 3,693,112 | 9/1972 | Briggs ................................. 331/111 |
| 3,714,463 | 1/1973 | Laune ................................. 307/232 |
| 3,755,746 | 8/1973 | Hogue et al. ....................... 328/133 |
| 3,866,133 | 2/1975 | Debloois et al. .................... 329/104 |
| 3,989,931 | 11/1976 | Phillips ................................ 235/92 |
| 4,020,422 | 4/1977 | Underhill ............................ 328/133 |

Primary Examiner—Eugene R. LaRoche
Assistant Examiner—Robert J. Pascal
Attorney, Agent, or Firm—Richard K. Robinson; George A. Montanye; H. Fredrick Hamann

[57] ABSTRACT

A phase detector for a phase lock loop can detect more than a $2\pi$ radian phase difference. The phase detector is modulized so that modules may be stacked to extend the phase detection range by $2N\pi$ radians, where N equals the number of modules that are stacked together. The modules are combined to obtain an output signal which can be applied to a filter for controlling the voltage of the voltage-controlled oscillator.

5 Claims, 4 Drawing Figures 4,500,852

WIDE RANGE PHASE DETECTOR UTILIZING A PLURALITY OF STACKED DETECTOR MODULES

BACKGROUND OF THE INVENTION

This invention relates to phase detectors that are used in synchronizing systems, and in particular, to phase detectors that may obtain greater than 360° in phase error.

Some phase lock loops that utilize phase detectors have large phase excursions at the phase detector input causing a large output frequency change from the phase lock loop. These excursions may greatly exceed the usual $2\pi$ or $4\pi$ radian phase range of digital phase detectors, such as that disclosed in U.S. Pat. No. 3,989,931 or U.S. Pat. No. 3,431,509. When the phase limit is reached in the prior art detectors, the phase lock loop goes out of lock and considerable time is lost until the reestablishment of phase lock is achieved. Phase detectors with much larger phase range have been tried, but were unacceptable because of disturbances during coincidences or crossover of the two pulses that were used as reference pulses. In the case where ring counters are used, a modulation at a subharmonic of the reference frequency that is used to control the phase lock loop is generated.

SUMMARY OF THE INVENTION

A phase detector for a phase lock loop can detect more than a $2\pi$ radian phase difference. The phase detector is modulized so that modules may be stacked to extend the phase detection range by $2\pi$ radians, where N equals the number of modules that are stacked together. The modules are combined to obtain an output signal which can be applied to a filter for controlling the voltage of the voltage-controlled oscillator.

It is the object of the invention to provide a phase detector that is made of a plurality of modules with each module capable of detecting up to $2\pi$ radians of phase error.

It is another object of the invention to provide a modular phase detector in which each of the modules includes a latch and a lock-out circuit.

It is another object of the invention to provide a phase detector circuit in which each module includes a latch that provides a first logic indication for every reference pulse that passes through the lock-out means and a second logic indication for every signal pulse that passes through the lock-out means.

It is still yet another object of the invention to provide a phase detector circuit having a plurality of modules in which time delays in the paths of the reference pulses and the signal pulses are selected to ensure a smooth transition at coincidence.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
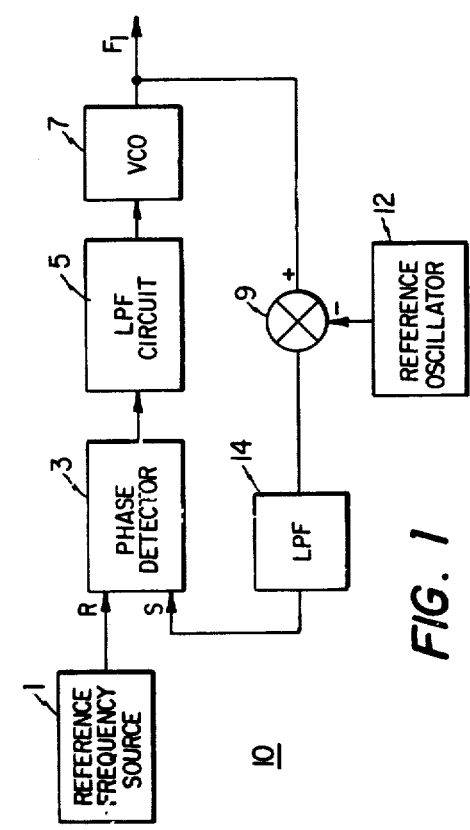
FIG. 1 is a block diagram of a phase lock loop incorporating the phase detector according to the invention.

FIG. 1, to which reference should now be made, shows a block diagram of a phase lock loop 10 incorporating a phase detector 3. The phase detector 3 compares a reference pulse at its "R" terminal that is provided by a reference frequency source 1, with a signal pulse at its "S" terminal that is the output of a voltage-controlled oscillator (VCO) 7. A mixer 9 obtains the difference between the voltage-controlled oscillator 7 frequency and a second reference frequency provided by the second reference oscillator 12 to obtain a product signal that is filtered by the Low Pass Filter (LPF) 14. This action brings the VCO 7 frequency into the range of the reference frequency R as provided by the reference frequency source 1. The output of the phase detector 3 is applied to a low pass filter (LPF) circuit 5 where it is converted to a voltage to which the voltage-controlled oscillator 7 will respond.

Figure 2:
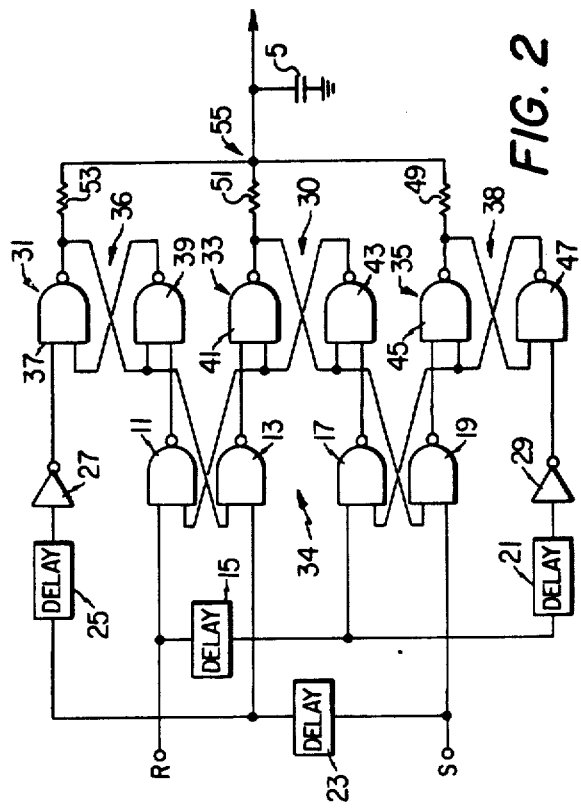
FIG. 2 is a schematic diagram of the phase detector according to the invention.

The phase detector 3 of FIG. 1 may include a plurality of modules and in the preferred embodiment as shown in FIG. 2 there are three modules shown; a first module 31, a second module 33 and an Nth module 35 where N is a positive integer and in the case of FIG. 2 is equal to 3. Each module is capable of detecting $2\pi$ radians or 360° phase errors between a first signal and a second signal that are applied to its "R" and "S" terminals. The first module includes a NAND gate latch 36 that is made up of NAND gates 37 and 39. The "R" terminal is applied to the first stage module via an inverter gate 27 and the "S" terminal is connected to the NAND gate latch 36 via the NAND gate 11. NAND gate 11 constitutes a lock-out circuit. The second module 33 includes a second NAND gate latch 30 which is made up of NAND gates 41 and 43, and a lock-out circuit 34 that comprise the NAND gates 13 and 17. For all modules other than the first module 31 and the Nth module 35, the lock-out should include two NAND gates. The Nth module 35 includes a NAND gate latch 38 configured with NAND gates 45 and 47 and a lock-out circuit of NAND gate 19. The output of the modules are summed by an adder circuit 55 that includes a first output resistor 53, a second output resistor 51 and a third output resistor 49. Additionally to ensure that there are no glitches at coincidences and to compensate for the time delays through each of the NAND gates that are used to make up either the latching circuit or the lock-out circuits, there are delays 23 and 25 between the "S" terminal and inverter 27 with delay 23 also being between the "S" terminal and NAND gate 13. Similarly, delays 15 and 21 are between the "R" terminal and inverter 29 with delay 15 also being between the "R" terminal and NAND gate 17. It should be noted that the phase range of $2\pi$ radians per module is reduced by the amount of delay per module, which in practice is usually a negligible amount.

Figure 3:
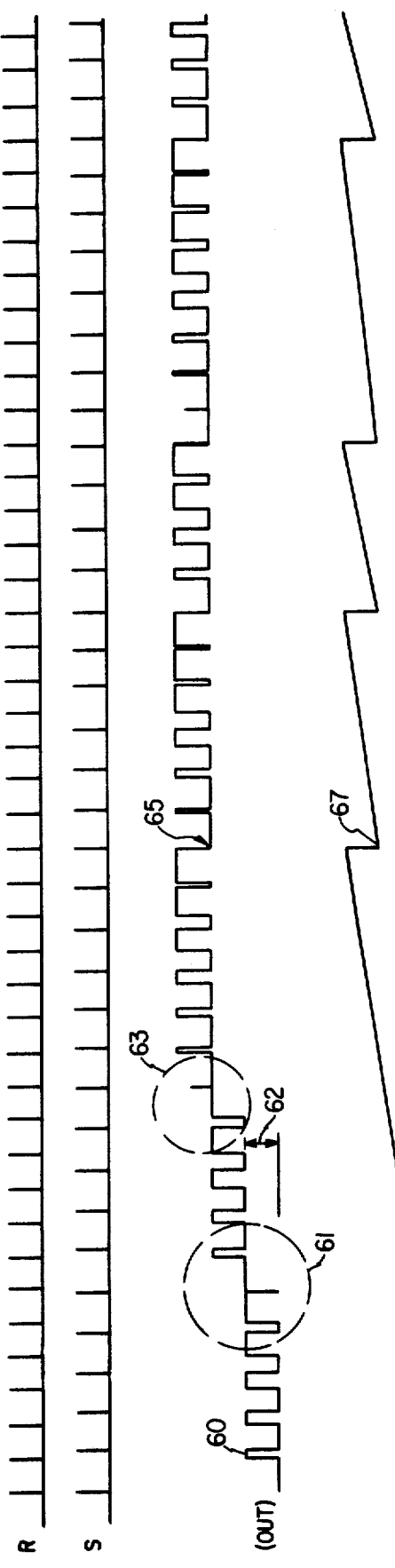
FIG. 3 is a timing diagram illustrating the operation of the phase detector of FIG. 2.

FIG. 3, to which reference should now be made, illustrates the operation of the circuit of FIG. 1 and in particular the phase detector 3 of FIG. 1. Waveform S is the output of the mixer 9 as it appears at the "S" terminal of the phase detector 3 and waveform R is the output of the reference frequency source 1 as it appears at the "R" terminal of the phase detector 3. The phase detector 3 compares the phases of the R and S pulses and provides signals that represent the difference between the phases. This is illustrated by waveform 3(out) of FIG. 3. Pulse 60 represents the difference between the corresponding R and S pulses that occur at that point. It should be noted that a transition, as illustrated by balloon 61, occurs where the phase difference between the R and the S pulse is greater than $2\pi$ radian, and in which case the signal level is increased by the amount illustrated by dimension lines 62 to show that there is a greater than $2\pi$ radian phase error. Balloon 63 illustrates an additional phase transition in which there is a greater than $4\pi$ radian phase difference detected by the phase detector 3. Transition 63 illustrates the transition from $6\pi$ radian phase difference that is detected by the embodiment illustrated in FIG. 2. The phase detector 3 returns to a $4\pi$ phase difference when there is a greater than $6\pi$ phase difference, and the process repeats until the circuit achieves lock. Waveform 5(out) illustrates the output signal of the low pass filter 5 which filters the output of the phase detector 3 waveform 3(out) to obtain a smooth voltage signal to which the voltage-controlled oscillator 7 will respond. The transition 65 is illustrated in waveform 5(out) by transition 67.

Figure 4:
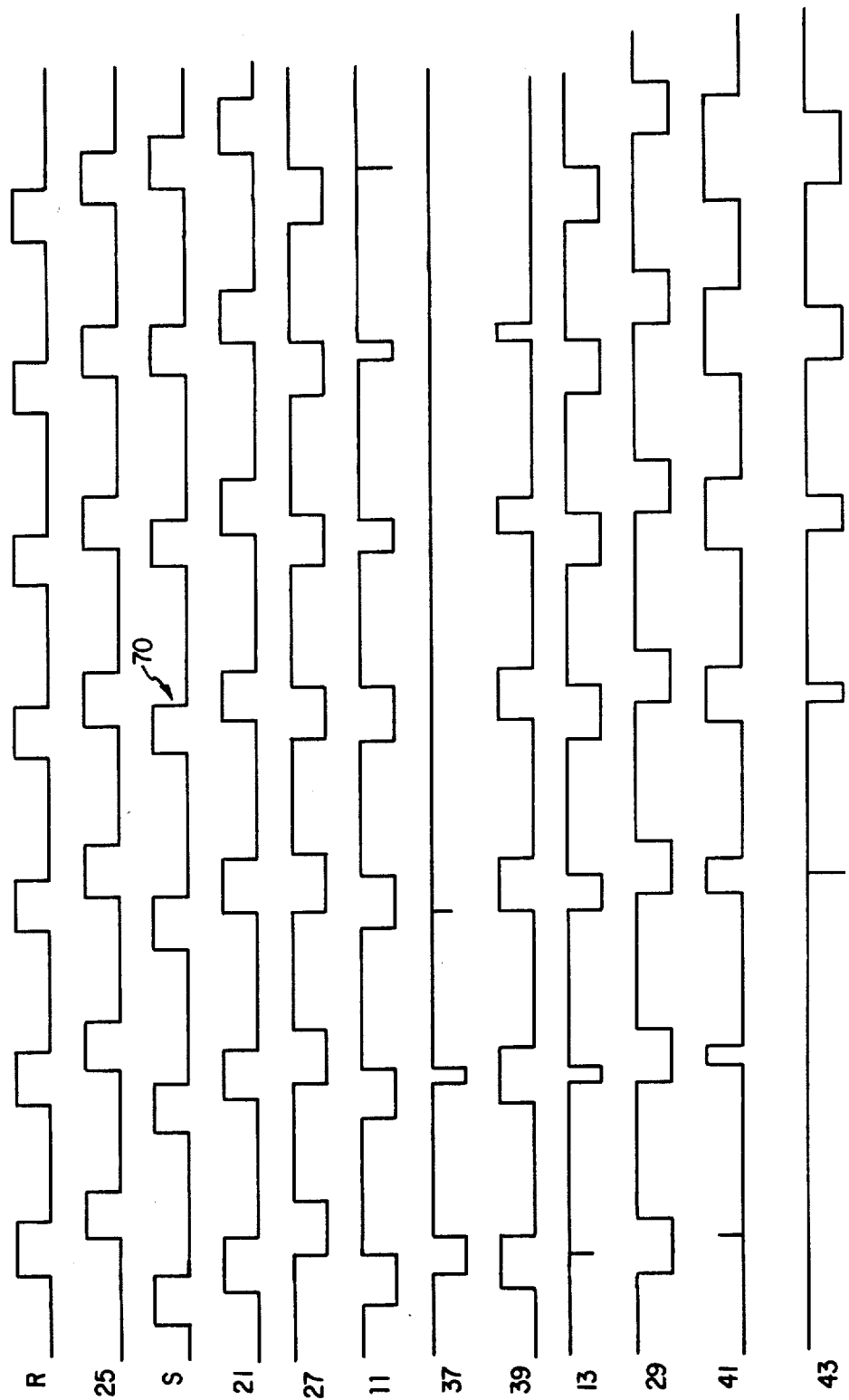
FIG. 4 is a timing diagram illustrating the transition when the detected phase difference is greater than $2\pi$ radians.

FIG. 4 illustrates the transitional phases more distinctly than FIG. 3, while also illustrating the operation of the circuit of FIG. 2 which should be viewed in conjunction with FIGS. 3 and 4. In FIG. 4, the reference numeral for the waveform corresponds to the circuit numbers on FIG. 2 from which the signal originates. A comparison between the R and S pulses indicates that the S pulse passes through a $2\pi$ radian phase difference at approximately point 70. At this stage, the first $2\pi$ radian module 31 obtains a solid logic state indicating that there is more than $2\pi$ radian error. This is illustrated by waveform 37. Waveform 41 shows that the second $2\pi$ radian module 33 is making the comparison between the R and the S pulses and is picking up control from the first $2\pi$ radian module 31. Waveform 25 shows the output of the delay 25 which includes a two gate delay in the S pulse. Waveform 21 includes a two gate delay in the R waveform. The output of the inverter 27 is represented by waveform 27 and corresponds at this point to the complement of the S pulse with the appropriate gate delays included therein. Waveform 11 illustrates the lock-out device for the first module and includes the NAND of the R waveform and waveform 43. Comparing two as the transition occurs between the first $2\pi$ radian module 31 and the second $2\pi$ radian module 33, waveform 11 approaches a logic 1 state, whereas waveform 43 begins to follow the S waveform 41 in a responsive manner, although it is the NAND combination of waveforms 43 and waveform 13. Waveform 47 is combined with the R pulse by the NAND gate 17 as part of the lock-out of the second $2\pi$ radian module 30. Waveform 29 essentially at this stage follows the R pulse. However, if the phase difference as detected by the phase detector 3 is greater than $4\pi$ then its influence on the circuit would correspond to that of the NAND gate 17.

Although the present invention has been described with respect to a particular embodiment thereof, it is not to be so limited as changes might be made therein which fall within the invention as defined in the appended claims.

What is claimed is:

1. A phase detector for detecting the phase difference between first and second pulse streams comprising:
means for receiving a first pulse stream;
means for receiving a second pulse stream;
a plurality of N phase discriminating modules, where N is a positive integer, each of said modules being coupled to receive an input of said first and second pulse streams and providing a phase detection output and including a phase detector means for detecting and providing a phase detection output representing up to 360° of phase difference between the first pulse stream and the second pulse stream and an associated lock-out means coupled to said phase detector means for locking out the phase detector means following the detection of 360° phase difference, said phase detector means and lock-out means of said plurality of modules being interconnected such that phase detection sequences from one module to the next for each 360° of phase difference; and
means for combining the phase detection outputs of said plurality of N modules to produce a signal representing the phase difference between said first and second pulse streams.

2. The phase detector of claim 1 wherein each phase detector means includes first and second NAND gates having two inputs and an output wherein said first NAND gate has one input coupled to receive a signal representing said first pulse stream and a second input coupled to the output of said second NAND gate and said second NAND gate has one input coupled to the output of said first NAND gate and a second input coupled to receive a signal representing said second pulse stream, the output of said first NAND gate forming said phase detection output.

3. The system of claim 2 wherein the lock-out means associated with the phase detector means of first and last modules of said plurality of modules comprises a single NAND gate and wherein the lock-out means associated with the phase detector means other than for the first and last modules of said plurality of modules comprises a pair of NAND gates.

4. A phase lock loop comprising:
means for providing a first pulse stream representing a first reference frequency;
a lowpass filter having an input and output;
a voltage controlled oscillator having an input coupled to receive the output of said lowpass filter and provide an output of a second pulse stream;
means for providing a third pulse stream representing a second reference frequency;
means for mixing said second and third pulse streams to provide a fourth pulse stream; and
a phase detector comprising:
means for receiving said first pulse stream;
means for receiving said fourth pulse stream;
a plurality of N phase discriminating modules, where N is a positive integer, each of said modules being coupled to receive an input of said first and fourth pulse streams and providing a phase detection output and including a phase detector means for detecting and providing a phase detection output representing up to 360° of phase difference between the first pulse stream and the fourth pulse stream and an associated lock-out means coupled to said phase detector means for locking out the phase detector means following the detection of 360° phase difference, said phase detector means and lock-out means of said plurality of modules being interconnected such that the phase detection sequences from one module to the next for each 360° of phase difference; and means for combining the phase detection outputs of said plurality of N modules to produce a signal representing phase difference between said first and second pulse streams.

5. A phase detector comprising:

a first terminal coupled to receive a first pulse stream;

a second terminal coupled to receive a second pulse stream;

a first delay circuit having an input coupled to receive said first pulse stream and an output providing a first delayed output of said first pulse stream;

a second delay circuit having an input coupled to the output of said first delay circuit and an output providing a second delayed output of said first pulse stream;

a third delay circuit having an input coupled to receive said second pulse stream and an output providing a first delayed output of said second pulse stream;

a fourth delay circuit having an input coupled to the output of said third delay circuit and an output providing a second delayed output of said second pulse stream;

a first inverter having an input coupled to the output of said fourth delay circuit and an output providing an inversion of said second delayed output of said second pulse stream;

a second inverter having an input coupled to the output of said second delay circuit and an output providing an inversion of said second delayed output of said first pulse stream;

a first NAND gate having first and second inputs and an output, the first input of said first NAND gate being coupled to the output of said first inverter;

a second NAND gate having first and second inputs and an output, the first input of said second NAND gate being coupled to the output of said first NAND gate, and the output of said second NAND gate being coupled to the second input of said first NAND gate;

a third NAND gate having first and second inputs and an output, the first input of said third NAND gate being coupled to said first terminal and the output of said third NAND gate being coupled to the second input of said second NAND gate;

a fourth NAND gate having first and second inputs and an output, the first input of said fourth NAND gate being coupled to the output of said first NAND gate and the second input of said fourth NAND gate being coupled to the output of said third delay circuit;

a fifth NAND gate having first and second inputs and an output, the first input of said fifth NAND gate being coupled to the output of said fourth NAND gate;

a sixth NAND gate having first and second inputs and an output, the first input of said sixth NAND gate being coupled to the output of said fifth NAND gate and the output of said sixth NAND gate being coupled to the second input of said fifth NAND gate and third NAND gate;

a seventh NAND gate having first and second inputs and an output, the first input of said seventh NAND gate being coupled to the output of said first delay circuit and the output of said seventh NAND gate being coupled to the input of said sixth NAND gate;

an eighth NAND gate having first and second inputs and an output, the first input of said eighth NAND gate being coupled to the output of said fifth NAND gate and the second input of the eighth NAND gate is coupled to said second terminal;

a ninth NAND gate having first and second inputs and an output, the first input of said ninth NAND gate being coupled to the output of said eighth NAND gate;

a tenth NAND gate having first and second inputs and an output, the first input of said tenth NAND gate being coupled to the output of said ninth NAND gate, the second input of said tenth NAND gate being coupled to the output of said second inverter, and the output of said tenth NAND gate being coupled to the second input of said ninth and seventh NAND gates; and said outputs of said first, fifth and ninth NAND gates being coupled in common as a phase detector output.

* * * * *